(12) United States Patent
Singh et al.

(10) Patent No.: US 9,257,984 B2
(45) Date of Patent: Feb. 9, 2016

(54) MULTI-THRESHOLD CIRCUITRY BASED ON SILICON-ON-INSULATOR TECHNOLOGY

(71) Applicant: Wave Semiconductor, Inc., Sunnyvale, CA (US)

(72) Inventors: Gajendra Prasad Singh, Sunnyvale, CA (US); Roger Carpenter, Palo Alto, CA (US)

(73) Assignee: Wave Semiconductor, Inc., Campbell, CA (US)

( * ) Notice: Subject to any disclaimer, the term of this patent is extended or adjusted under 35 U.S.C. 154(b) by 0 days.

(21) Appl. No.: 14/487,678

(22) Filed: Sep. 16, 2014

(65) Prior Publication Data

US 2015/0076564 A1  Mar. 19, 2015

Related U.S. Application Data

(60) Provisional application No. 61/879,058, filed on Sep. 17, 2013, provisional application No. 61/894,390, filed on Oct. 22, 2013, provisional application No. 61/931,586, filed on Jan. 25, 2014.

(51) Int. Cl.

| | | |
|---|---|---|
| H01L 27/10 | (2006.01) | |
| H03K 19/0948 | (2006.01) | |
| H01L 27/12 | (2006.01) | |
| G06F 17/50 | (2006.01) | |
| H01L 21/84 | (2006.01) | |
| H03K 19/08 | (2006.01) | |
| H03K 19/20 | (2006.01) | |

(52) U.S. Cl.
CPC .......... *H03K 19/0948* (2013.01); *G06F 17/505* (2013.01); *G06F 17/5072* (2013.01); *H01L 21/84* (2013.01); *H01L 27/1203* (2013.01); *H03K 19/0813* (2013.01); *H03K 19/20* (2013.01)

(58) Field of Classification Search
CPC ................ H01L 31/336; H01L 29/423; H01L 27/11807
USPC ........... 257/206, 314, 321, E29.345; 438/289
See application file for complete search history.

(56) References Cited

U.S. PATENT DOCUMENTS

| | | | |
|---|---|---|---|
| 5,625,300 A * | 4/1997 | Sachdev | ................. 324/750.3 |
| 7,375,000 B2 | 5/2008 | Nowak et al. | |

(Continued)

OTHER PUBLICATIONS

Ren, Zhibin, M. Ieong, J. Cai, J. Holt, D. Boyd, R. Mo, H. Yin et al. "Selective epitaxial channel ground plane thin SOI CMOS devices." In Electron Devices Meeting, 2005. IEDM Technical Digest. IEEE International, pp. 733-736. IEEE, 2005.

(Continued)

*Primary Examiner* — Phuc Dang
(74) *Attorney, Agent, or Firm* — Adams Intellex, PLC

(57) ABSTRACT

Multiple threshold voltage circuitry based on silicon-on-insulator (SOI) technology is disclosed which utilizes N-wells and/or P-wells underneath the insulator in SOI FETs. The well under a FET is biased to influence the threshold voltage of the FET. A PFET and an NFET share a common buried P-well or N-well. Various types of logic can be fabricated in silicon-on-insulator (SOI) technology using multiple threshold voltage FETs. Embodiments provide circuits including the advantageous properties of both low-leakage transistors and high-speed transistors.

20 Claims, 10 Drawing Sheets

(56) References Cited

U.S. PATENT DOCUMENTS

| | | | |
|---|---|---|---|
| 7,732,286 B2 | 6/2010 | Hanafi et al. | |
| 8,076,707 B1 * | 12/2011 | Hyde et al. | 257/314 |
| 8,203,182 B2 | 6/2012 | Muller et al. | |
| 8,707,234 B1 * | 4/2014 | Ye et al. | 716/115 |
| 2005/0253197 A1 * | 11/2005 | Tokushige | 257/347 |
| 2006/0102958 A1 | 5/2006 | Masleid | |
| 2007/0178639 A1 | 8/2007 | Cecchi et al. | |
| 2008/0157215 A1 | 7/2008 | Miyashita | |
| 2012/0299080 A1 | 11/2012 | Dennard et al. | |
| 2013/0214813 A1 | 8/2013 | Singh | |

OTHER PUBLICATIONS

Faynot, Oliver, M. Vinet, C. Fenouillet, O. Weber, P. Perreau, L. Grenouillet, F. Andrieu, T. Poiroux, and S. Deleonibus. "FDSOI technology: a power efficient solution down to 10nm." ECS Transactions 58, No. 9 (2013): 3-8.

Haond, M. "Features and Benefits of 14nm UTBB* FD-SOI Technology." In Semicon West Meeting, Jul. 9, 2013. STMicroelectronics, Crolles, France.

International Search Report dated Dec. 23, 2014 for PCT/US2014/055879.

* cited by examiner

MULTI-THRESHOLD CIRCUITRY BASED ON SILICON-ON-INSULATOR TECHNOLOGY

RELATED APPLICATIONS

This application claims the benefit of U.S. provisional patent applications "Multi-Threshold Circuitry Using Silicon-On-Insulator Technology" Ser. No. 61/879,058, filed Sep. 17, 2013, "Silicon-On-Insulator Technology with Multi-Threshold Circuitry" Ser. No. 61/894,390, filed Oct. 22, 2013, and "Multi-Threshold Circuitry Based On Silicon-On-Insulator Technology" Ser. No. 61/931,586, filed Jan. 25, 2014. The foregoing applications are each hereby incorporated by reference in their entirety.

FIELD OF ART

This application relates generally to logic circuitry and more particularly to silicon-on-insulator (SOI) technology combined with multi-threshold circuitry including multiple threshold voltages for transistors within the circuitry.

BACKGROUND

The manufacture of advanced, high-speed integrated circuits demands advanced technologies capable of supporting systems that include tens or hundreds of millions of active devices. Such technologies support market demands for ever-increasing system performance, feature sets, and system capabilities. Silicon on Insulator (SOI) is one such technology capable of implementing the feature and speed requirements of advanced integrated circuits. SOI offers reduced parasitic circuit activities and unwanted electrical connections, thus providing benefits in terms of reduced capacitance and increased device speed. SOI is also capable of significantly improving power consumption in comparison to traditional bulk silicon technologies.

Field-effect transistor (FET) devices have been used to implement logic circuitry and memory devices. In the FET, current flows along a semiconductor path called the channel. At one end of the channel, there is an electrode called the source. At the other end of the channel, there is an electrode called the drain. The source/drain regions can be doped with either N-type or P-type dopants; the FET devices are designed such that the carriers are either electrons (NFETs) or holes (PFETs). The FET devices act as switches that are controlled by a voltage applied to the gate. When the voltage applied to the gate is set appropriately, current can easily flow between the source and drain of the FET device; the FET device is effectively a closed switch. Conversely, when the voltage applied to the gate is set at a different level, current cannot easily flow between the source and the drain, and the FET device behaves as an open switch.

Field-effect transistors can be classified into planar field-effect transistors and 3D (vertical) field-effect transistors. In the case of planar field-effect transistors, the channel region is formed parallel to a substrate surface, which can contain the active regions of multiple electronic semiconductor components. One such type of 3D field-effect transistor is the fin-type field-effect transistor (finFET), in which case, the channel connecting the source and drain is a thin, fin-like structure extending perpendicularly out of the base substrate.

In modern electronic designs, there are many factors to consider that involve design tradeoffs. These factors include power consumption during operation, power consumption during standby (or sleep) modes, and device performance (including switching speed). Additionally, circuit density is becoming increasingly important for portable electronic devices. Hence the ability to fit more transistors within a given area is another desirable feature of modern integrated circuits. Often, at least some of these factors involve compromises; for example, improving performance in one area (e.g. device speed) comes at the expense of performance in another area (e.g. power consumption), rendering integrated circuit design increasingly challenging.

SUMMARY

The present disclosure provides a method for improving the performance of Silicon-on-Insulator (SOI) circuits by implementing various threshold voltage (Vth) transistors in the circuits. Circuits are created by arranging a plurality of transistors to form a logic gate in an SOI technology—a technology that includes wells under an insulator. Voltage biasing is applied to the buried wells to impact the Vth of one or more transistors in logic gates so that the gates include one or more higher-threshold voltage transistors and one or more lower-threshold voltage transistors. The logic gates can be of various types including Boolean logic, null convention logic (NCL), and other types including higher-threshold voltage transistors and lower-threshold voltage transistors. In embodiments, the plurality of transistors includes one or more three-dimensional transistors. In embodiments, the one or more three-dimensional transistors include fin type field effect transistors (finFETs).

An apparatus for digital evaluation is disclosed comprising: a plurality of transistors to form a logic gate where the plurality of transistors are formed in a silicon-on-insulator (SOI) semiconductor technology wherein: the plurality of transistors include a plurality of PFETs; the plurality of transistors include a plurality of NFETs; a first PFET, from the plurality of PFETs, and a first NFET, from the plurality of NFETs, share a first buried well under an insulator in the silicon-on-insulator semiconductor technology; a second PFET, from the plurality of PFETs, and a second NFET, from the plurality of NFETs, share a second buried well under an insulator in the silicon-on-insulator semiconductor technology; and a first connection that biases the first buried well and a second connection that biases the second buried well. The logic gate may implement a Boolean logic operation. In some embodiments, the logic gate is part of a clocked Boolean logic circuit.

Various features, aspects, and advantages of various embodiments will become more apparent from the following further description.

BRIEF DESCRIPTION OF THE DRAWINGS

The following detailed description of certain embodiments may be understood by reference to the following figures wherein.

DETAILED DESCRIPTION

The performance of electronic systems relies on the abilities of the various transistors which make up the logic gates and other circuits in electronic system to switch quickly. The switching speed, also called the transition speed, of the transistors is directly dependent on the threshold voltage (Vth) of the transistors. But low threshold voltage transistors, while they switch quickly, have higher leakage currents, resulting in larger overall circuit power consumption.

Currently disclosed are methods and systems to apply bias voltages by implementing bias connections to the wells under insulating material beneath the silicon on insulator devices are presently disclosed. The bias voltages are designed to impact threshold voltages of the logic gates and permit the logic gates to include higher threshold voltage transistors and lower threshold voltage transistors. The higher threshold voltage transistors can be used to limit circuit power consumption while the lower threshold voltage transistors can be used for high-speed logic evaluation. Due to the insulating under layer found in SOI circuits, NFETs and PFETs can share the same well. In some cases this well is an N-well while in others it is a P-well. Among the various types of logic gates possible, Boolean logic, null convention logic (NCL), and other logic gates can be formed from a plurality of transistors including higher-threshold voltage transistors and lower-threshold voltage transistors.

Figure 1:
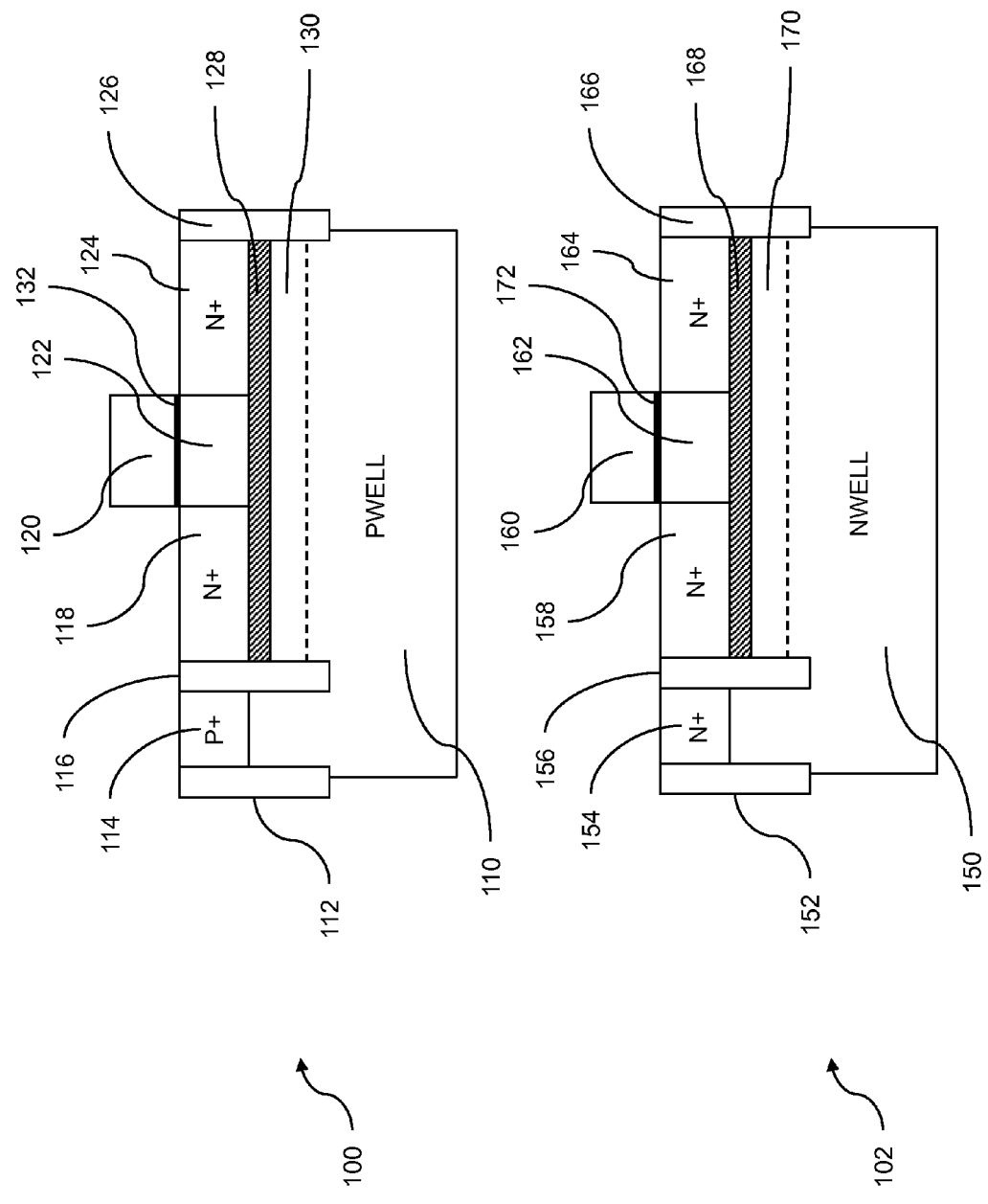
FIG. 1 shows example SOI NFET transistor cross sections.

FIG. 1 shows example SOI NFET transistor cross sections. It should be noted that sometimes NFET devices are referred to as N-type metal-oxide-semiconductor logic (NMOS). Transistor cross section 100 shows an NFET transistor with a P-well 110 underneath the NFET and an insulating layer 128, while transistor cross section 102 shows an NFET transistor with an N-well 150 underneath the NFET and an insulating layer 168. Within this disclosure, the term "well" can be used to describe either an N-well or a P-well. The well is formed by doping a region of a semiconductor substrate with embodiments featuring a silicon wafer as the substrate. In the case of an N-well, the semiconductor substrate is doped with an N-type dopant such as arsenic or phosphorous. In the case of a P-well, the semiconductor substrate is doped with a P-type dopant such as boron. In embodiments, the well under the insulating layer includes a common well for an NFET and a PFET, while in other embodiments there can be one or more separate N-wells or P-wells. The figure labels many components of a typical NFET device. For example, each transistor possesses a source, such as source 118 and source 158; a drain, such as drain 124 and drain 164; and a gate, such as gate 120 and gate 160. In the figure shown, the sources and drains are heavily doped, denoted by N+. In some cases the sources and drains are symmetric, meaning that the sources and drains seen in the illustrated cross sections could be reversed without altering physical design parameters. In addition to the setup illustrated in the diagram, other transistor structures are also possible.

In FIG. 1, the region 122 under gate 120 and the region 162 under gate 160 are fully depleted (FD). The region 122 and the region 162 serve as areas in which channels can form, allowing the connection of the source 118 to the drain 124, and the source 158 to the drain 164, respectively. The gates 120 and 160 are electrically isolated from regions 122 and 162 by a thin dielectric layer—a thin dielectric layer 132 separates gate 120 from region 122, and another thin dielectric layer 172 separates gate 160 from region 162. In some embodiments, the dielectric layers 132 and 172 are comprised of a high-K dielectric material, such as hafnium oxide. The insulators 112, 116, 126, 152, 156, and 166 are used to separate adjacent transistors from one another. These insulators can be comprised of an oxide, such as silicon oxide, and can be referred to as shallow trench isolation (STI) regions. The insulators 112, 116, 126, 152, 156 and 166 separate the example NFET devices from any adjacent devices, whether the neighboring transistors are NFET or PFET devices. Additional insulators, 128 and 168, are buried underneath the active transistor device regions. These buried oxide layers, or BOX layers, isolate the transistors from layers under the transistors.

Continuing with the example, the transistors shown have a well under an insulating layer in the silicon-on-insulator semiconductor technology. Underneath one transistor 100 there is a P-well 110, and underneath the other transistor 102 there is an N-well 150. In the case of the transistor cross section 102 and the transistor cross-section 100, the well under each insulator can be referred to as a flip well (a well disposed underneath the buried insulators 128 and 168). Connections are made to the P-well of the first transistor 100 and the N-well of the second transistor 102 via contacts 114 and 154, respectively. The connection of biasing voltages for the well under an insulator of the transistor 100 or the other transistor 102 can be made in such a manner that a threshold voltage for the one or more of the plurality of transistors is impacted in order that a logic gate includes a higher threshold voltage transistor and a lower threshold voltage transistor. The contacts are heavily doped to reduce resistance between the body contacts and the wells. The contact 114 is doped to P+ to provide a low resistance contact to P-well 110 and the contact 154 is doped to N+ to provide a low resistance contact to the N-well 150. Between the respective wells and the buried oxide layers, there is a so-called ground plane (GP) layer. In the case of the first transistor 100, the ground plane is type P (GPP) 130, and in the case of the second transistor 102, the ground plane is type N (GPN) 170. The ground planes (GPP or GPN) can be of the same doping concentration of their respective wells or can be of low resistance with a higher doping concentration than a typical well. The ground planes can electrically bias nearby gate regions of the transistors by applying voltage to the first well 110 and the second well 150 via contacts 114 and 154 in order to affect the threshold voltages of the first transistor 100 and the second transistor 102 respectively. The applied bias voltages can, in embodiments, include forward body bias (FBB) voltages and reverse body bias (RBB) voltages. In the case of SOI technology, the transistor body is floating, and thus the FBB (forward body bias) and RBB (reverse body bias) voltages refer to the biasing for the well even if the biasing is only capacitive. The applied bias voltages can decrease the threshold voltages of the first transistor 100 and the second transistor 102, or can increase the threshold voltages of the first transistor 100 and the second transistor 102. The effects of changing threshold voltages of the first transistor 100 and the second transistor 102 can be, depending on the embodiment, decreased transistor transition (switching) times, decreased leakage, and so on, as desired by the system designer. In one example, a biased well with a high voltage, such as +1.5V or +2.0V, can decrease the Vth for an NFET associated with that biased well, causing that NFET to have a faster switching time. For example, without any bias, an NFET can have a threshold voltage (Vt) of about 0.3 volts, and with a positive bias in the range of about +1.5 volts to about +2.0 volts, the Vt of the NFET, in this example, would be in the range of about 0.13 volts to about 0.18 volts. In another example, a well with a low voltage, such as −1.5V, can increase the Vth for an NFET associated with the biased well causing the NFET to have a lower current leakage. For example, the Vt of the NFET can increase from an unbiased Vt of about 0.3 volts to an increased Vt ranging from about 0.4 volts to about 0.5 volts. It will be understood that, in embodiments, an NFET and a PFET can share a well below an SOI insulator.

Figure 2:
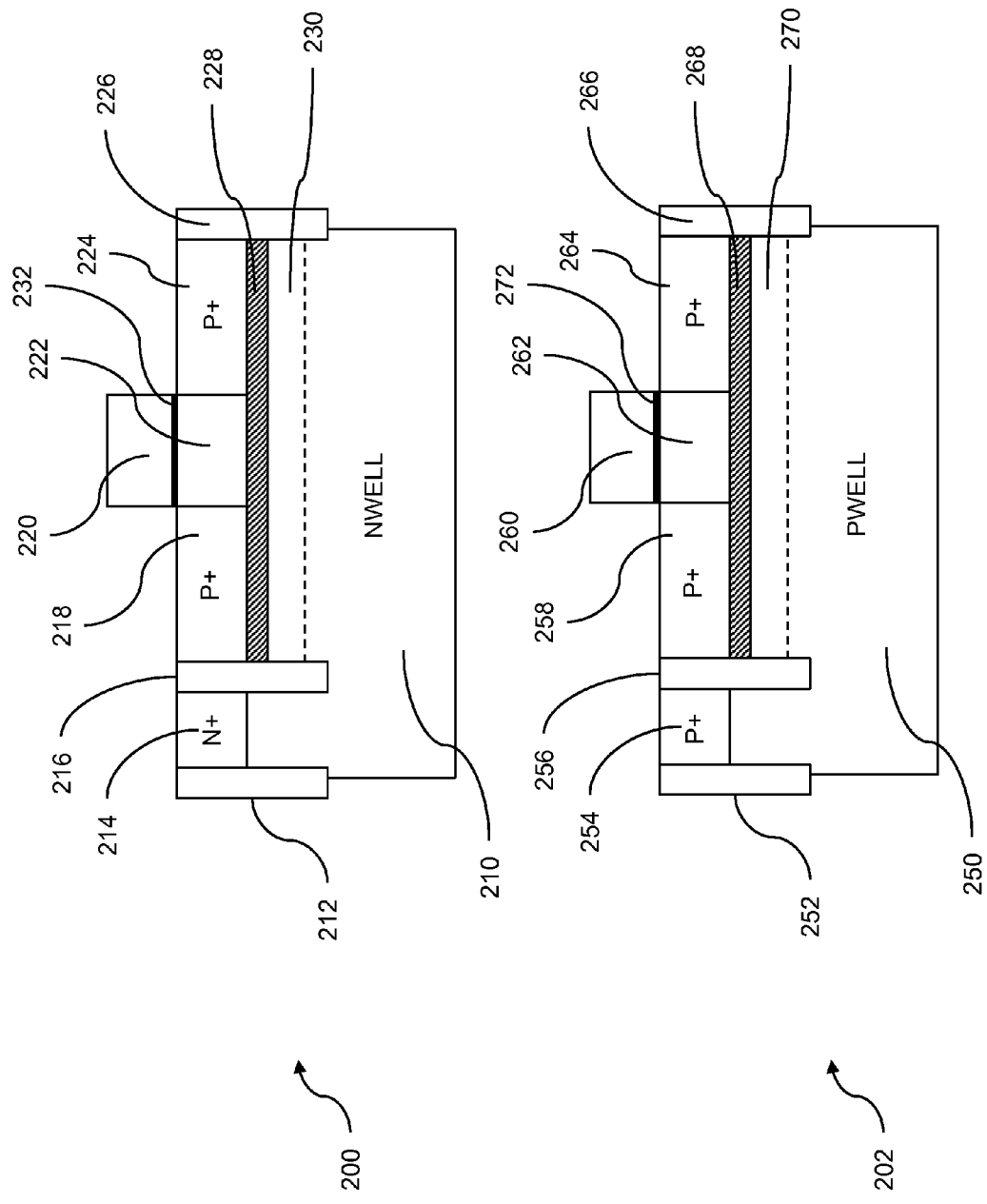
FIG. 2 shows example SOI PFET transistor cross sections.

FIG. 2 shows example SOI PFET transistor cross sections. It should be noted that sometimes PFET devices are referred to as P-type metal-oxide-semiconductor logic (PMOS). The structures of the first PFET transistor 200 and the second PFET transistor 202 are similar to those of the first NFET transistor 100 and the second NFET transistor 102 of FIG. 1, with the primary differences between the PFET devices and the NFET devices being the doping of the sources, drains, and so on. Transistor cross section 200 shows a PFET transistor with an N-well underneath the PFET and an insulator 228, and transistor cross section 202 shows a PFET transistor with a P-well underneath the PFET and an insulator 268. In embodiments, the well under an insulator includes a common well for an NFET and a PFET, while in other embodiments, there are one or more separate N-wells and/or P-wells. As was the case for the NFET devices, PFET devices contain many components. Each transistor possesses a source, 218 and 258; a drain, 224 and 264; and a gate, 220 and 260. Other PFET transistor structures can also be envisioned. In the example transistors shown, the sources and drains are both heavily doped, denoted by the P+ labels. The regions under gates 220 and 260 as well as 222 and 262, are, in this example, fully depleted (FD). The regions 222 and 262 constitute regions in which channels can form to make connections between source 218 and source 258 and drain 224 and drain 264, respectively. The gates 220 and 260 are electrically isolated from regions 222 and 262 by a thin dielectric layer—a dielectric layer 232 separates gate 220 from region 222, and another thin dielectric layer 272 separates gate 260 from region 262. In some embodiments, the dielectric layers 232 and 272 are comprised of a high-K dielectric material, such as hafnium oxide. The insulators 212, 216, 226, 252, 256 and 266 separate the example PFET devices from any adjacent devices, whether PFET or NFET. Buried oxide (BOX) layers serve as additional insulators—insulator 228 and insulator 268 serving as examples.

Continuing with the example, the one or more of the plurality of transistors have a well under an insulator in the silicon-on-insulator semiconductor technology. Underneath the transistor 200 lies an N-well 210, and underneath the transistor 202 lies a P-well 250. In the case of the cross sections 200 and 202, the well under an insulator can be referred to as a flip well (a well disposed underneath the buried insulator 228 or 268). Connections are made to the N-well found in cross section 200 and the P-well found in cross section 202 via contacts 214 and 254 respectively. As was the case for the NFET transistors above, the connection of biasing voltages for the well under an insulator of transistor 200 or 202 can be made so that a threshold voltage for one or more transistors is impacted. The result is that a logic gate can include a higher threshold voltage transistor and a lower threshold voltage transistor. The contacts are heavily doped to reduce resistance between the contacts and the wells. Between the respective wells and the buried oxide layers, there is a so-called ground plane (GP) layer. Transistor 200 has an N-type ground plane layer (GPN) 230, and transistor 202 has a P-type ground plane layer (GPP) 270. The ground plane layers (GPP or GPN) can have the same doping as their respective wells, or can have lower resistance and higher doping than a typical well. The ground planes can serve as electrical biasing for the nearby gate regions of the transistors. A bias voltage can be applied to each well 210 and 250 via contacts 214 and 254 in order to affect the threshold voltages of transistors 200 and 202, respectively. The applied bias voltages can include forward body bias (FBB) voltages and reverse body bias (RBB) voltages. As before, the effect of the applied bias voltages can, in embodiments, decrease the magnitude of the threshold voltages of transistors 200 and/or 202, or increase the threshold voltages of transistors 200 and/or 202. The effects of changing threshold voltages of transistors 200 and 202 can be a reduction in transistor transition (switching) times, a decrease in leakage, and the like. In one example, a well with a high voltage, such as +1.5V or +2.0V, can increase the Vth for a PFET associated with that biased well, causing that PFET to have a lower leakage. In another example, a well with a low voltage, such as −1.5V, can decrease the Vth for a PFET associated with that biased well, causing that PFET to have a faster switching time. It will be understood that, in embodiments, an NFET and a PFET can share a well below an SOI insulator.

Figure 3:
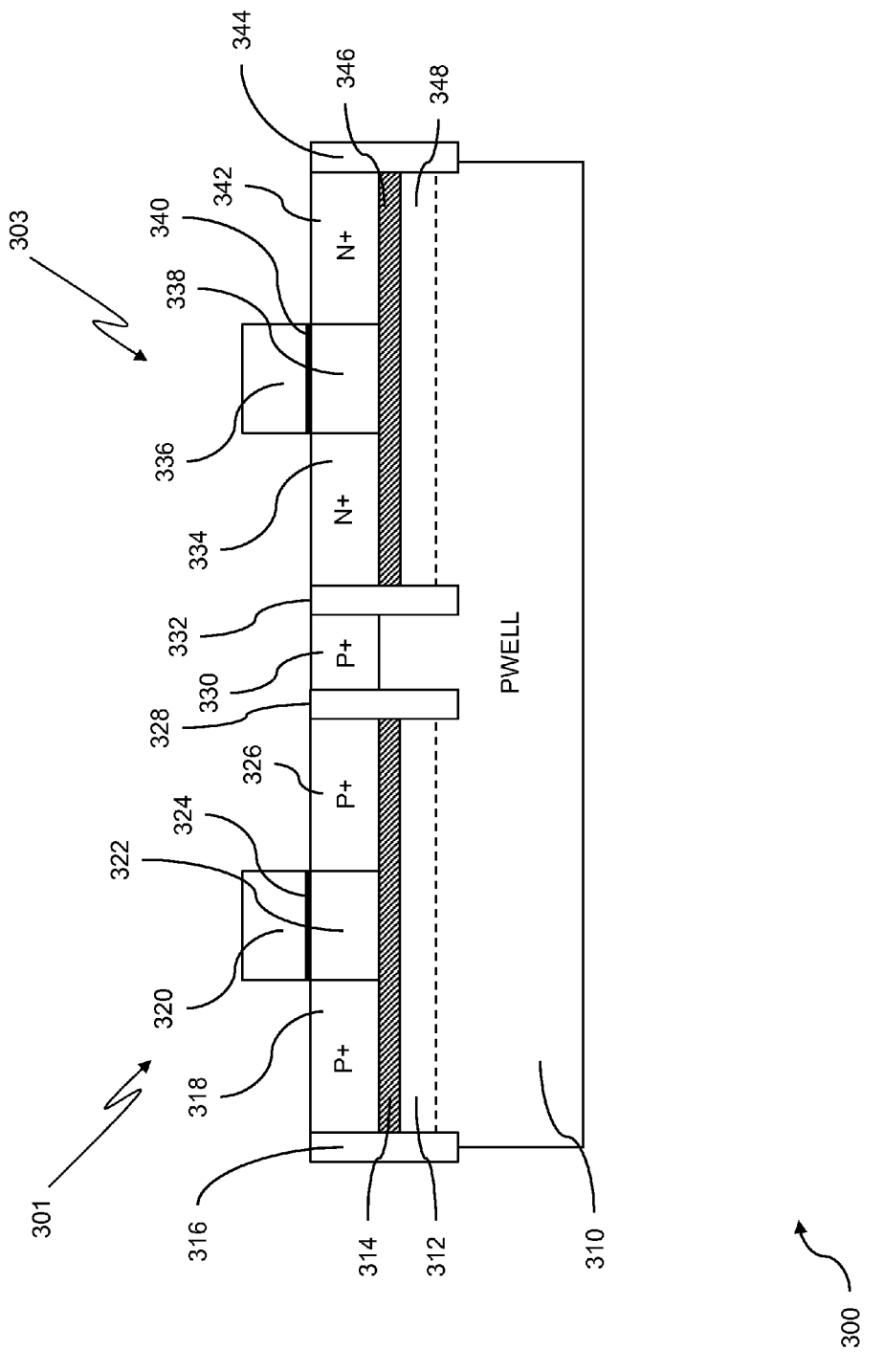
FIG. 3 shows an example PFET and NFET in a P-Well.

FIG. 3 shows example SOI PFET and SOI NFET transistor cross-sections in a common P-well. Transistor cross section 300 shows a PFET transistor 301 and an NFET transistor 303, with a common P-well 310. The P-well 310 is underneath the PFET and an insulator 314 along with the NFET and an insulator 346. Many features common to PFET and NFET devices are noted in the figure. Each transistor (PFET and NFET) possesses a source—326 and 334—a drain—318 and 342—and a gate—320 and 336. The sources and drains are heavily doped, as denoted by P+ for the PFET and N+ for the NFET. In some cases, the sources and drains are symmetrical, allowing for the sources and drains shown in FIG. 3 to be reversed without altering design parameters or function. Other transistor structures can also be imagined. The regions under gates 320 and 336, areas 322 and 338 respectively, are in this example fully depleted (FD). The regions 322 and 338 are the regions in which channels can form to make connections between sources and drains 326 and 318; and 334 and 342, respectively. The gates 320 and 336 are each electrically isolated from regions 322 and 338 by thin dielectric layers, 324 and 340 respectively, which can be referred to as gate dielectrics. The insulators 316 and 328 along with 332 and 344, are used to separate adjacent transistors from one another. The insulators 316, 328, 332, and 344 separate the example PFET and NFET devices from any adjacent devices, whether PFET or NFET. Additionally, insulators 314 and 346 are buried underneath the active transistor device regions. These buried oxide (BOX) layers isolate the transistors from layers under the PFET and NFET transistors 300.

Continuing with the example, a first PFET, from the plurality of PFETs, and a first NFET, from the plurality of NFETs, share a first buried well under an insulator in the silicon-on-insulator semiconductor technology. Underneath the transistors 300, there is a shared P-well 310. In the case of the cross section of the PFET shown in FIG. 3, the well under the insulators can be referred to as a flip well. Connection is made to the P-well 310 via a contact 330. Similarly, but not shown, a second PFET, from the plurality of PFETs, and a second NFET, from the plurality of NFETs, share a second buried well under an insulator in the silicon-on-insulator semiconductor technology. The connection of biasing voltages for the well under the transistors can be made where the first buried well is biased so that the first PFET or the first NFET has a low threshold voltage and the second buried well is biased so that the second PFET or the second NFET has a high threshold voltage. Low threshold voltages are desirable for transistors in logic circuits where the transistors require quick switches, among other uses. In embodiments, one of the first PFET or the first NFET has a high threshold voltage. High threshold voltages are desirable in pull-up and/or pull-down transistors, for example, where the transistors require low current leakage.

In embodiments, biasing for the first buried well is changed dynamically. Dynamic biasing can be used to cause the transistors to have different threshold voltages at different times, allowing a circuit to switch quickly when speed is preferred to current leakage, and to have low current leakage at other times. The one or more body contacts are heavily doped to reduce resistance between the body contacts and the wells. The contact 330 is doped P+ to provide a low resistance contact to the shared P-well 310. Between the well and the buried oxide layers, there is a so-called ground plane (GP) layer. The transistor 300 shown has two P-type ground plane layers (GPP) 312 and 348. The ground plane can have the same doping level as its respective well, or can have lower resistance and higher doping than a typical well. The ground plane can electrically bias the nearby gate regions of the transistors. A bias voltage can be applied to a well 310 via one or more contacts, such as contact 330, in order to affect the threshold voltages of the PFET and the NFET transistors. The applied bias voltages can include forward body bias (FBB) voltages and reverse body bias (RBB) voltages. The effect of the applied bias voltages can decrease the threshold voltages of the transistor or can increase the threshold voltages of the transistor. The effects of changing threshold voltages of transistors can be decreased transistor transition (switching) times, decreased leakage, and so on. In one example, a well with a high voltage, such as +1.5V or +2.0V, can decrease the Vth for an NFET associated with that biased well, causing that NFET to have a faster switching time. In another example, a well with a low voltage, such as −1.5V, can increase the Vth for an NFET associated with that biased well, causing that NFET to have a lower leakage.

Figure 4:
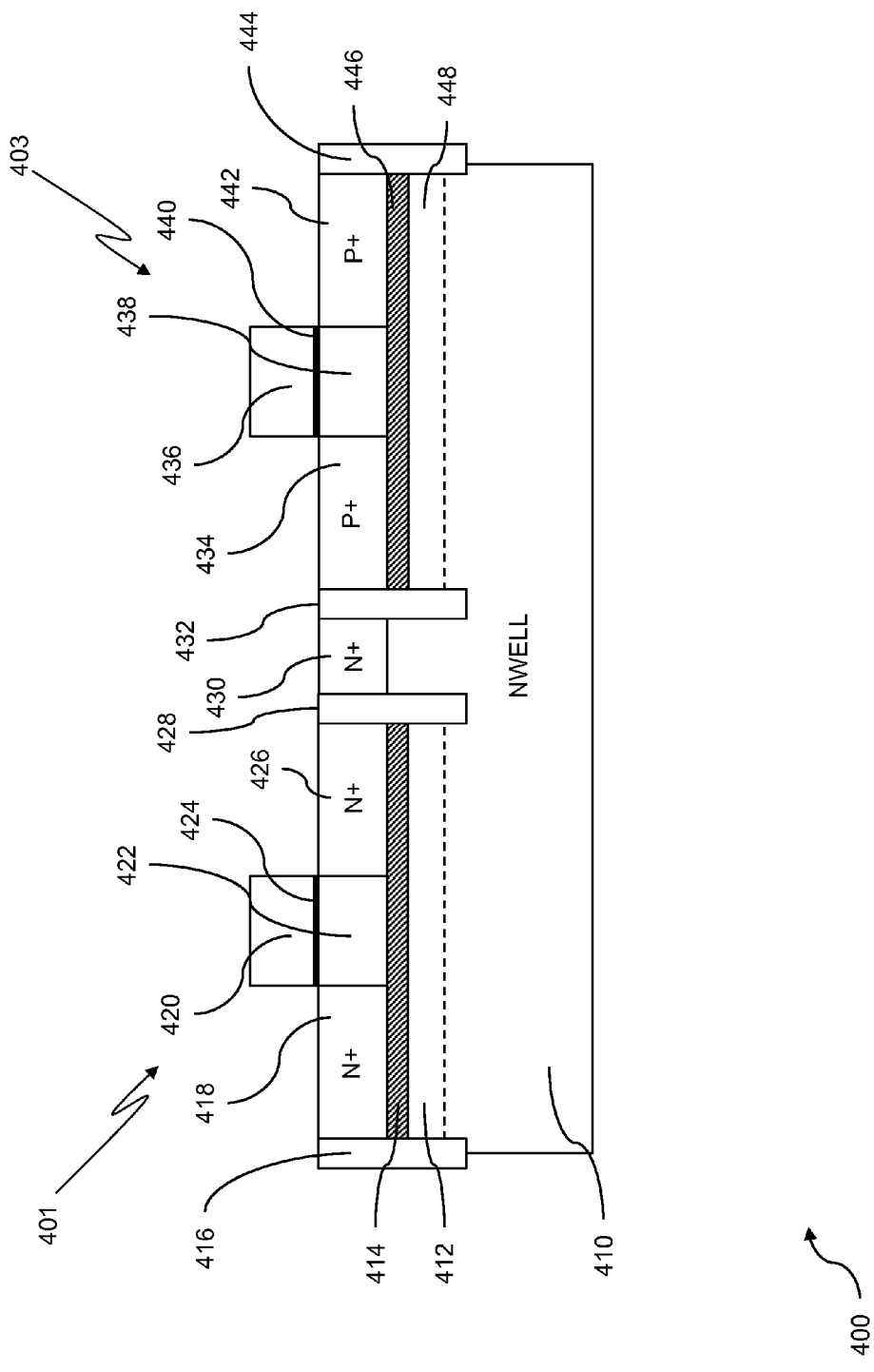
FIG. 4 shows an example NFET and PFET in an N-Well.

FIG. 4 shows a SOI PFET transistor and a SOI NFET transistor cross-section in a common N-well. The structures of the NFET 401 and PFET 403 transistors seen coexisting on transistor cross section 400 are similar to those of PFET and NFET transistors 300 of FIG. 3, with the primary difference between the figures being a common N-well 410 instead of a common P-well 310. Similar to FIG. 3, transistor cross section 400 shows an NFET transistor and a PFET transistor, but these are shown with a common N-well underneath the NFET and its insulating layer as well as underneath the PFET and its insulating layer. As was the case for the PFET and NFET devices above, many components are labeled in the figure. Each transistor possesses a source 426 and 434, a drain, 418 and 442, and a gate, 420 and 436. In embodiments, the source and drain for each transistor can be reversed without changing transistor function. The sources and drains are similarly heavily doped, denoted by the N+ labels and the P+ labels. Other NFET and PFET transistor structures can also be envisioned. The regions under the gates 420 and 436—regions 422 and 438 respectively—are, in this example, fully depleted (FD). The regions 422 and 438 are the regions in which channels can form to make connections between the source and the drain 426 and 418; and between the source and the drain 434 and 442, respectively. The gates 420 and 436 are electrically isolated from regions 422 and 438 by thin dielectric layers, 424 and 440 respectively. The insulators 416, 428, 432, and 444 are used to separate adjacent transistors from one another. The insulators 416, 428, 432, and 444 separate the example NFET and PFET devices from any adjacent devices, whether PFET or NFET. Additionally, insulators 414 and 446 are buried oxide (BOX) layers, similar to the BOX layers of the PFET and NFET devices above.

Continuing with the example, a second PFET, from the plurality of PFETs, and a second NFET, from the plurality of NFETs, share a second buried well under an insulator in the silicon-on-insulator semiconductor technology. Underneath the transistors shown lies a shared N-well 410. The wells under an insulator can be referred to as flip wells. Connection is made to the N-well of 400 via contact 430. As was the case for the PFET and NFET transistors above, the connection of biasing voltages for the well under an insulator of transistors 400 can be made so that a threshold voltage for one or more transistors is impacted to ensure that a logic gate includes a higher threshold voltage transistor and a lower threshold voltage transistor. High threshold voltages are desirable for pull-up and/or pull-down transistors where the transistors have low current leakage, among other applications. In embodiments, biasing for the second buried well is changed dynamically. Dynamic biasing can be used to cause the transistors to have different threshold voltages at different times, allowing a circuit to switch quickly when speed is preferred to current leakage, and to have low current leakage at other times. In embodiments, one of the second PFET or the second NFET has a high threshold voltage. The contact 430 is heavily doped to reduce resistance between the contact and the well. Between the respective well and the buried oxide layers, there is a so-called ground plane (GP) layer. The transistor 400 shown has two N-type ground plane wells, 412 and 448. The ground plane, whether GPP or GPN, can have the same doping level as its respective wells or can have lower resistance and higher doping than a typical well. The ground planes can electrically bias the nearby gate regions of the transistors. A bias voltage can be applied to the well 410 via a contact 430 in order to affect the threshold voltages of the transistors 400. The applied bias voltages can include forward body bias (FBB) voltages and reverse body bias (RBB) voltages. As before, the effect of the applied bias voltages is, in different embodiments, decreased magnitude of the threshold voltages of transistors 400, or increased magnitude of the threshold voltages of transistors 400. Some of the effects of changing threshold voltages of transistors 400 include decreased transistor transition (switching) times, decreased leakage, and so on. In one example, a well with a high voltage, such as +1.5V or +2.0V, can increase the Vth for a PFET associated with that biased well, causing that PFET to have a lower leakage. In another example, a well with a low voltage, such as −1.5V, can decrease the Vth for a PFET associated with that biased well, causing that PFET to have a faster switching time.

Figure 5:
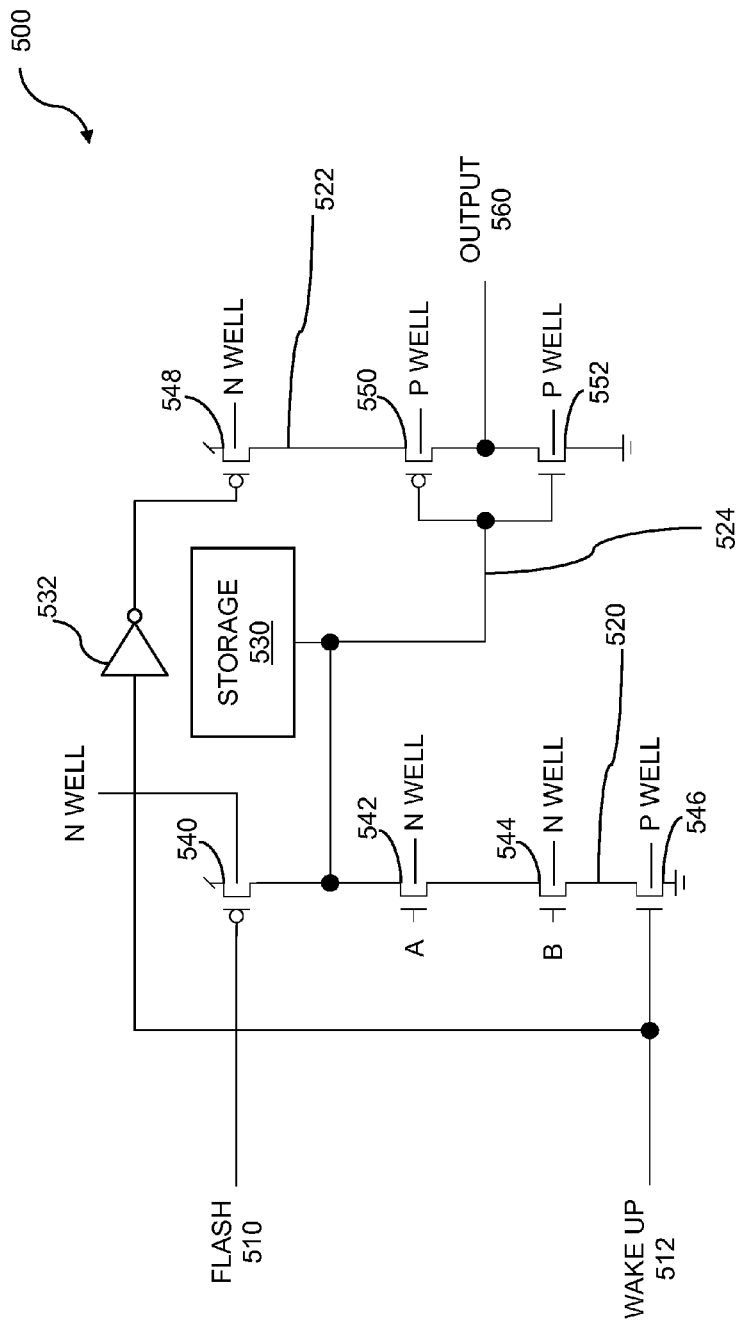
FIG. 5 is an example circuit with multiple threshold voltages.

FIG. 5 is an example circuit including transistors with different threshold voltages. The example circuit 500 shows a plurality of transistors which form a logic gate. In practice, numerous configurations of transistors and other electronic components can be used to form logic gates. The logic gate can have varying numbers of inputs, outputs, and control signals. In the example shown, the circuit has two input signals, a first signal A and a second signal B, one output signal 560, and two control signals—flash 510 and wake-up 512. For some circuits, the flash signal 510 serves as a pre-charge or setup signal, while the wake-up signal 512 serves as an activation signal, enabling evaluation. The plurality of transistors which form the logic gate are formed using a silicon-on-insulator (SOI) semiconductor technology. Various design techniques can be employed to enhance the performance of the logic gate including modifying threshold voltages for transistors. Threshold voltage adjustment can be employed to increase switching speed, to reduce leakage current, and so on. In embodiments, the one or more of the plurality of transistors have a well under an insulator in the silicon-on-insulator (SOI) semiconductor technology. The type of well implemented under an insulator in the SOI technology can be an N-well or a P-well and includes a doping profile appropriate to the performance and control of the transistors comprising the circuit built using SOI technology. In embodiments, N-well dopants include arsenic and/or phosphorous, and P-well dopants include boron. The N-well or the P-well can be used to combine transistors into a single well in order to simplify and improve the layout of the circuit. In embodiments, connections are made to the well or wells under the insulator of the SOI technology. In embodiments, the connecting of biasing for the well under an insulator is accomplished so that a threshold voltage for the one or more of the plurality of transistors is impacted, allowing the logic gate to include a higher threshold voltage transistor and a lower threshold voltage transistor. The logic gate can include transistors with differing threshold voltages in order to control switching speed, leakage, and so on. The logic gate is formed from any of a variety of logic families. In some embodiments, the implementing of the plurality of transistors, including a higher-threshold voltage transistor and a lower-threshold voltage transistor, is performed where the logic gate is a null convention logic (NCL) gate. The null convention logic gate can be a multi-threshold null convention gate.

Returning to the circuit 500, the NCL gate can include a higher-threshold voltage NFET and a lower-threshold voltage NFET. The higher and lower-threshold FETs, which are shown in FIG. 5, each include a source contact, a drain contact, and a buried well contact. The buried well is below the insulator of the SOI FET. In this example circuit, NFETs 542 and 544 have lower threshold voltages to allow rapid evaluation of inputs A and B. Another NFET 546 can be in a different well from NFET 542 and NFET 544, as illustrated in the example circuit. In this case, the N-well for NFETs 542 and 544 is biased to an elevated voltage, such as +1.5V. In embodiments, the lower-threshold voltage NFET is used for logical evaluation. Example pull-up (or header) devices include PFET 540 and PFET 548, while example pull-down (or footer) devices include NFET 546. The header transistor can include a source connection and a drain connection where the drain connection provides a virtual power supply rail. The footer transistor can have a high threshold voltage that limits current through the logic gate. The footer transistor can provide a virtual ground rail. The pull-up and pull-down devices can be included in N-wells or P-wells as needed, considering various factors including desired switching speed, power dissipation, and so on. The NCL gate can include a higher threshold voltage PFET and a lower threshold voltage PFET. As was the case for the NFET devices, the threshold voltages of the PFET devices are chosen considering various factors including desired switching speed, power dissipation, and so on. The higher-threshold voltage PFET can be in a pull-up path, limiting current draw when the NCL gate is in an off state. An example of such a PFET is seen in the PFET 540. When the PFET 540 turns on, it pulls a node 524 high. When PFET 540 turns off, node 524 is held high by storage element 530, in this example. In embodiments, a weak latch circuit implements storage element 530. When PFET 540 turns off, it is a desirable design parameter in some designs for PFET 540 to maintain a low leakage. Thus, the PFET 540 has a buried N-well biased to an elevated voltage, such as +1.5V, causing the PFET 540 to have a higher threshold voltage. The N-well for NFETs 542 and 544 can be an N-well in common with the N-well of PFET 540.

Similar to the pull-up device discussed above, the NCL gate can include a higher-threshold voltage NFET to limit current through the NCL gate. The limiting of current through the NCL gate can help maintain a virtual zero at a virtual ground rail (VSS rail) node, such as node 520 in the example shown. In embodiments, the higher-threshold voltage NFET 546 is in a pull-down path, limiting current draw when the NCL gate is in an off state. The NCL gate can be pre-charged by a flash connection. An NCL logic gate can be a flash NCL gate, as shown in this example. In embodiments, modified threshold voltages can be equally applicable to static NCL logic gates. The flash NCL gate can have an output driver or inverter to drive the output signal 560. In this example circuit the PFET 550 and the NFET 552 act as an output inverter. The devices can be built in the same or different P-wells, the same or different N-wells, or can be built in a separate N-well and P-well. The output driver can have a header device, such as PFET 548, which limits leakage current when the output 560 is low. The header device 548 can have its well at an elevated voltage to increase the threshold voltage of the PFET 548. The well of PFET 548 can be an N-well and can be a common N-well with PFET 540 as well as NFETs 542 and 544. The PFET 548 can be operated by a signal such as wake-up signal 512 that is inverted by the inverter 532. The PFET pull-up device 548 can provide a virtual power supply (VDD rail) signal 522 for the output inverter.

Figure 6:
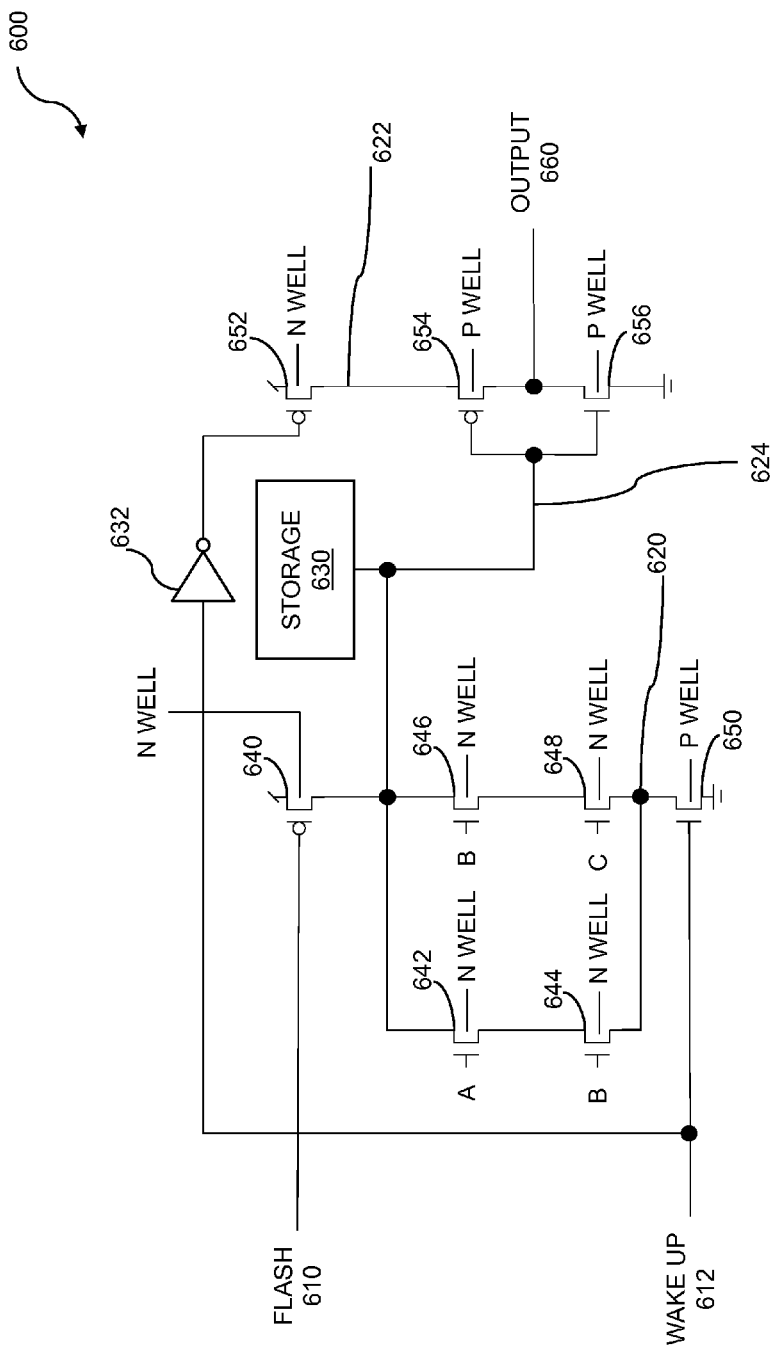
FIG. 6 shows an example M-of-N NCL circuit.

FIG. 6 shows an example M-of-N NCL circuit 600 with transistors having differing threshold voltages in SOI technology. Circuit 600 includes a plurality of NFET transistors 642, 644, 646, and 648. Transistors 642 and 644 are connected in series (source to drain) in a first totem pole circuit portion, and transistors 646 and 648 are connected in series (source to drain) in a second totem pole circuit portion. Input A is connected to the gate of transistor 642. Input B is connected to both the gate of transistor 644 and the gate of transistor 646. Input C is connected to the gate of transistor 648. As such, the plurality of transistors form a logical AND-OR gate that evaluates the logical expression ((A AND B) OR (B AND C)). In embodiments, a fourth input D (not shown) is connected to the gate of transistor 646 instead of input B. In such an embodiment, the plurality of transistors form a logical AND-OR gate that evaluates the logical expression ((A AND B) OR (C AND D)). Thus, the logic gate can implement a Boolean logic operation. Transistors 642, 644, 646, and 648 can be formed over a common well, such as an N-well. In embodiments, the well is biased to place transistors 642, 644, 646, and 648 in a condition with a reduced threshold voltage Vt, allowing the transistors to switch states faster.

The circuit 600 also includes two control signals, flash 610, and wake-up 612. For some circuits, the flash signal 610 can serve as a pre-charge or setup signal, while the wake-up signal 612 can serve as an activation signal, enabling evaluation. When the wake-up signal 612 is de-asserted, the circuit 600 enters a standby (sleep) mode. With transistor 650 configured as a low leakage transistor, power consumption of circuit 600 during standby mode is minimized. That is, even if transistors 642, 644, 646, and 648 are configured to be in high-speed mode (with a reduced Vt), leakage currents for the circuit 600 are reduced by configuring transistor 650 as a high voltage threshold circuit. In embodiments, transistor 650 is used to maintain a virtual zero at a virtual VSS rail node, such as node 620 in the example shown. Flash signal 610 is connected to the gate of PFET 640. In embodiments, PFET 640 is configured as a low-leakage (high Vt) transistor by appropriate voltage bias of its N-well. The low-leakage (higher-threshold voltage) PFET 640 can be in a pull-up path limiting current draw when the circuit 600 is in an off state. When the PFET 640 turns on, it pulls a node 624 high. When PFET 640 turns off, node 624 can be held high by storage element 630, for example. In embodiments, a weak latch circuit implements storage element 630. When PFET 640 turns off, design parameters can require that PFET 640 maintain a low leakage. In embodiments, the PFET 640 has a buried N-well biased to an elevated voltage, such as +1.5V, causing the PFET 640 to have a higher threshold voltage.

The circuit 600 also includes an output driver for driving output 660. In this example circuit a PFET 654 and a NFET 656 act together as an output inverter. The devices can be built in the same or different P-wells, the same or different N-wells, or in a separate N-well and P-well. The output driver can have a header device, such as PFET 652, which limits leakage current when the output 660 is low. The header device 652 can have its well at an elevated voltage to increase the threshold voltage of the PFET 652 to configure it to be in a low-leakage mode of operation. The well of PFET 652 can be an N-well and, in embodiments, is in a common N-well with PFET 610 as well as NFETs 642, 644, 646, and 648. The PFET 652 can be operated by a signal such as wake-up signal 612 that is inverted by an inverter 632. The PFET pull-up device 652 can provide a virtual VDD rail signal 622 for the output inverter.

Figure 7:
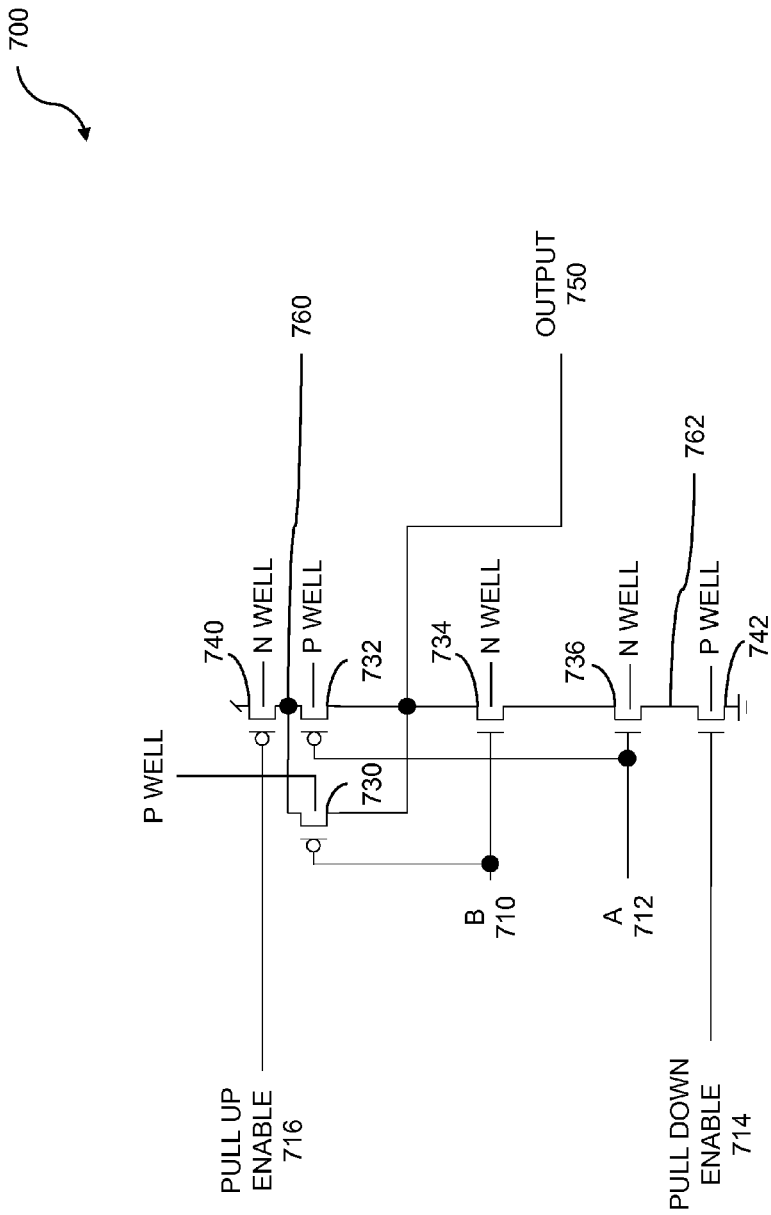
FIG. 7 shows an example Boolean circuit including transistors with different threshold voltages.

FIG. 7 is an example Boolean circuit which includes transistors with different threshold voltages. The example circuit 700 shows a plurality of transistors forming a Boolean NAND logic gate where the plurality of transistors are formed using silicon-on-insulator (SOI) technology. In embodiments the Boolean logic gate performs a Boolean logic operation. In practice, numerous configurations of transistors and other electronic components can be used to form Boolean logic gates such as NANDs, NORs, ANDs, ORs, NOTs, XORs, XNORs, AND-OR-INVERT (AOI) structures, and so on. In embodiments, the plurality of transistors include a plurality of PFETs. In the example shown, the NAND gate includes two PFETs, PFET 730 and PFET 732, plus a pull-up PFET 740. Similarly, the plurality of transistors can also include a plurality of NFETs. In the example shown, the NAND gate includes two NFETs, NFET 734 and NFET 736, plus a pull-down NFET 742. The Boolean logic gate can have varying numbers of inputs, outputs, and control signals. In the example shown, the circuit has two input signals, A 712 and B 710, one output signal OUTPUT 750, and two control signals, pull-down enable 714, and pull-up enable 716. For some circuits, the pull-up enable signal 716 serves as a flash, pre-charge or setup signal, while the pull-down enable signal 714 serves as a wake-up or activation signal, which enables evaluation of the logic gate. Various design techniques can be employed to enhance the performance of the logic gate including modifying threshold voltages for transistors. Threshold voltage adjustment can be employed to increase switching and logic evaluation speed, to reduce leakage current, and so on. In embodiments, the one or more of the plurality of transistors have a well under an insulator in the silicon-on-insulator (SOI) semiconductor technology. The type of well implemented under an insulator in the SOI technology can be an N-well or a P-well and can have a doping profile appropriate to the performance and control of the transistors comprising the circuit built in the SOI technology. The N-well or the P-well is implemented in various circuits to perform various modifications, such as combining transistors into a single well in order to simplify and improve layout of the circuit, among others. In embodiments, a first PFET, from the plurality of PFETs, and a first NFET, from the plurality of NFETs, share a first buried well under an insulator in the silicon-on-insulator semiconductor technology. In further embodiments, a second PFET, from the plurality of PFETs, and a second NFET, from the plurality of NFETs, share a second buried well under an insulator in the silicon-on-insulator semiconductor technology. The first FETs and the second FETs can be components of a logic gate, a Boolean logic gate, pre-charge circuitry, evaluation circuitry, and so on. The PFETs and NFETs can be combined into a single well to enhance circuit performance, to reduce leakage current, and so on. A connection can be made to the well or wells under the insulator in the SOI technology. In embodiments, a first connection biases the first buried well and a second connection biases the second buried well. In practice, any appropriate number of connections can be made to one or more buried wells. In further embodiments, the first buried well is biased so that the first PFET or the first NFET has a low threshold voltage, and the second buried well is biased so that the second PFET or the second NFET has a low threshold voltage. The logic gate can also include transistors with differing threshold voltages in order to control switching speed, leakage, and so on. In various embodiments, the logic gate is formed from any of a variety of logic families including dynamic logic families, static logic families, self-timed logic families, and so on. In some embodiments, the implementing of the plurality of transistors, including a higher-threshold voltage transistor and a lower-threshold voltage transistor, is performed where the logic gate is a Boolean logic gate. The Boolean logic gate can be a multi-threshold Boolean logic gate. In embodiments, the Boolean logic gate includes a pull-up device such as the pull up 740, while in other embodiments, the Boolean logic gate excludes a pull-up device. In embodiments, the Boolean logic gate includes a pull-down device such as the pull down 742, while in other embodiments, the Boolean logic gate excludes a pull-down device.

Returning to the circuit 700, the Boolean logic gate can include transistors where one of the first PFET or the first NFET has a high threshold voltage. The choice of whether the first PFET or the first NFET has a high threshold voltage depends, among other factors, on critical design criteria such as evaluation speed, leakage current, and so on. The Boolean logic gate can include transistors where one of the second PFET or the second NFET has a high threshold voltage. As with the first FET, the choice of whether the second PFET or the second NFET has a high threshold voltage depends on critical design criteria, among other factors. A Boolean logic gate can include a higher threshold voltage NFET and a lower threshold voltage NFET. A Boolean logic gate can include a higher threshold voltage PFET and a lower threshold voltage PFET. The FETs, also called transistors, which are shown in FIG. 7, each include a gate, a source contact, a drain contact, and a buried-well contact. The gate, source contact, drain contact, and buried-well contact can connect a single FET or a plurality of FETs. The buried well is below the insulator of the SOI FET. In this example circuit, the NFETs 734 and 736 have lower threshold voltages to allow rapid evaluation of inputs A and B. The NFET 742 can be in a well different from 734 and 736, as illustrated in the example circuit. In this case, the N-well for the NFETs 734 and 736 is biased to an elevated voltage, such as +1.5V. In embodiments, the lower-threshold voltage NFET is used for logical evaluation due to a faster switching speed. Continuing the example, the PFETs 730 and 732 can also have lowered threshold voltages, again to allow rapid evaluation of inputs A and B. The PFET 740 can be in a well different from 730 and 732, as illustrated in the example circuit. In this case, the P-well for the PFETS 730 and 732 is biased to a more negative voltage, such as −1.5V. In embodiments, the lower-threshold voltage PFET is used for logical evaluation. In embodiments, biasing for the first buried well is changed dynamically. Dynamic biasing of a well can prove useful for a variety of reasons including increasing circuit operation speed and logical evaluation speed for certain technical purposes, such as performance, and shutting down circuitry, thus reducing leakage current, during sleep mode, as two examples. In other embodiments, the second buried well is changed dynamically. As before, dynamic biasing of a second well can in turn improve circuit performance, reduce leakage current, and so on.

Continuing the example, a pull-up (or header) device includes a PFET 740, while an example pull-down (or footer) device includes an NFET 742. The pull-up and/or pull-down devices may or may not be included in the Boolean logic circuit. The pull-up and pull-down devices can be included in N-wells or P-wells for various design, technology, and performance considerations including switching speed, power dissipation, and so on. The Boolean logic gate can include a higher-threshold voltage PFET and a lower-threshold voltage PFET. As was the case for the NFET devices, the threshold voltages of the PFET devices can be chosen for considerations including switching speed, power dissipation, and so on. A PFET, from the plurality of PFETs, can be in a buried well with an NFET, from the plurality of NFETs, and in embodiments the PFET forms a header transistor. The higher-threshold voltage PFET can be in a pull-up path, and this PFET can limit current leakage when the Boolean gate is in an off or standby state. In embodiments, the header transistor has a high threshold voltage as a result of biasing for the buried well. Such biasing may ensure that leakage current through the pull-up device is reduced or minimized. An example of such a PFET is PFET device 740. When the PFET 740 turns on, it pulls node 760 high. When the PFET 740 turns off, node 760 can remain high, held in this state by source capacitances and other capacitances, for example. When PFET 740 turns off, a design parameter can specify that the PFET 740 maintain a low-leakage mode of operation. Towards this end, the PFET 740 has a buried well that is an N-well and this N-well is biased to an elevated voltage, such as +1.5V, causing the PFET 740 to have a higher threshold voltage than other PFETs in the Boolean circuit. The N-well for the NFETs 734 and 736 can be an N-well shared with the PFET 740. In embodiments, similarly to the pull-up device discussed above, an NFET, from the plurality of NFETs, is in a buried well with a PFET, from the plurality of PFETs, with the NFET forming a footer transistor. The Boolean logic gate can include a higher-threshold voltage NFET to limit current through the Boolean logic gate. The limiting of current through the Boolean logic gate can help to maintain a virtual zero at a virtual VSS rail node, such as node 762. In embodiments, the footer transistor has a high threshold voltage as a result of biasing for the buried well. In embodiments, the higher-threshold voltage NFET is in a pull-down path and this NFET limits current when the Boolean logic gate is in a disabled state. The Boolean logic gate can be pre-charged by a pull-up enable connection for the Boolean logic gate. A Boolean logic gate can comprise a static gate or a dynamic gate. In embodiments, modified threshold voltages can be equally applicable in either type of Boolean logic gates. In embodiments, the logic gate is part of a clocked Boolean logic circuit. Clocked Boolean logic circuits can be used for performance reasons such as evaluation enhancement, parallelization, and so on. In embodiments, the logic gate is part of a wake-up circuit. A wake-up circuit is often used to return a system, including many logic circuits, from a low-power or sleep state to normal operation. In embodiments, evaluation of the logic gate is used in a completion determination for a larger circuit. The use of a completion determination in a complex logic system can be desirable for performance and control reasons, and to reduce system complexity.

Figure 8:
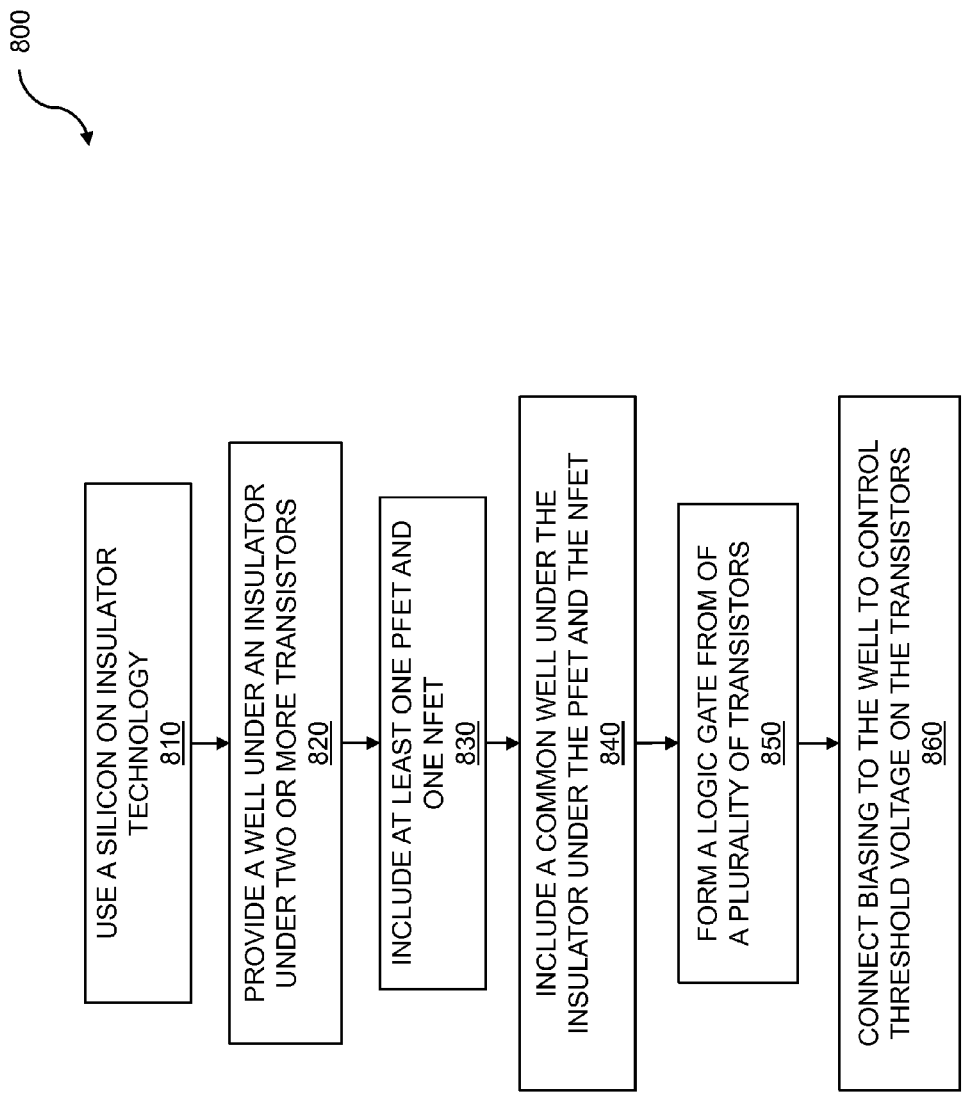
FIG. 8 shows a flow for multi-threshold logic implementation.

FIG. 8 shows a flow 800 for multi-threshold logic implementation. The flow 800 begins with using a silicon-on-insulator (SOI) technology 810. The SOI technology can include a substrate, such as a silicon wafer, with an insulator disposed thereon. The insulator can be a buried oxide (BOX) layer. Disposed over the BOX layer is another semiconductor layer, such as a second silicon layer. This second silicon layer can be referred to as a SOI layer. The flow continues with providing a well under an insulator under two or more transistors 820. The well can be an N-well or a P-well. The flow continues with including at least one NFET and at least one PFET 830. The flow continues with including a common well under the insulator under the PFET and NFET 840. The flow continues with forming a logic gate from a plurality of transistors 850. At least some of the plurality of transistors are then configured to be in either a low-leakage (high Vt) mode of operation or a high-speed (low Vt) mode of operation by connecting biasing to the well to control the threshold voltage on the transistors 860.

Figure 9:
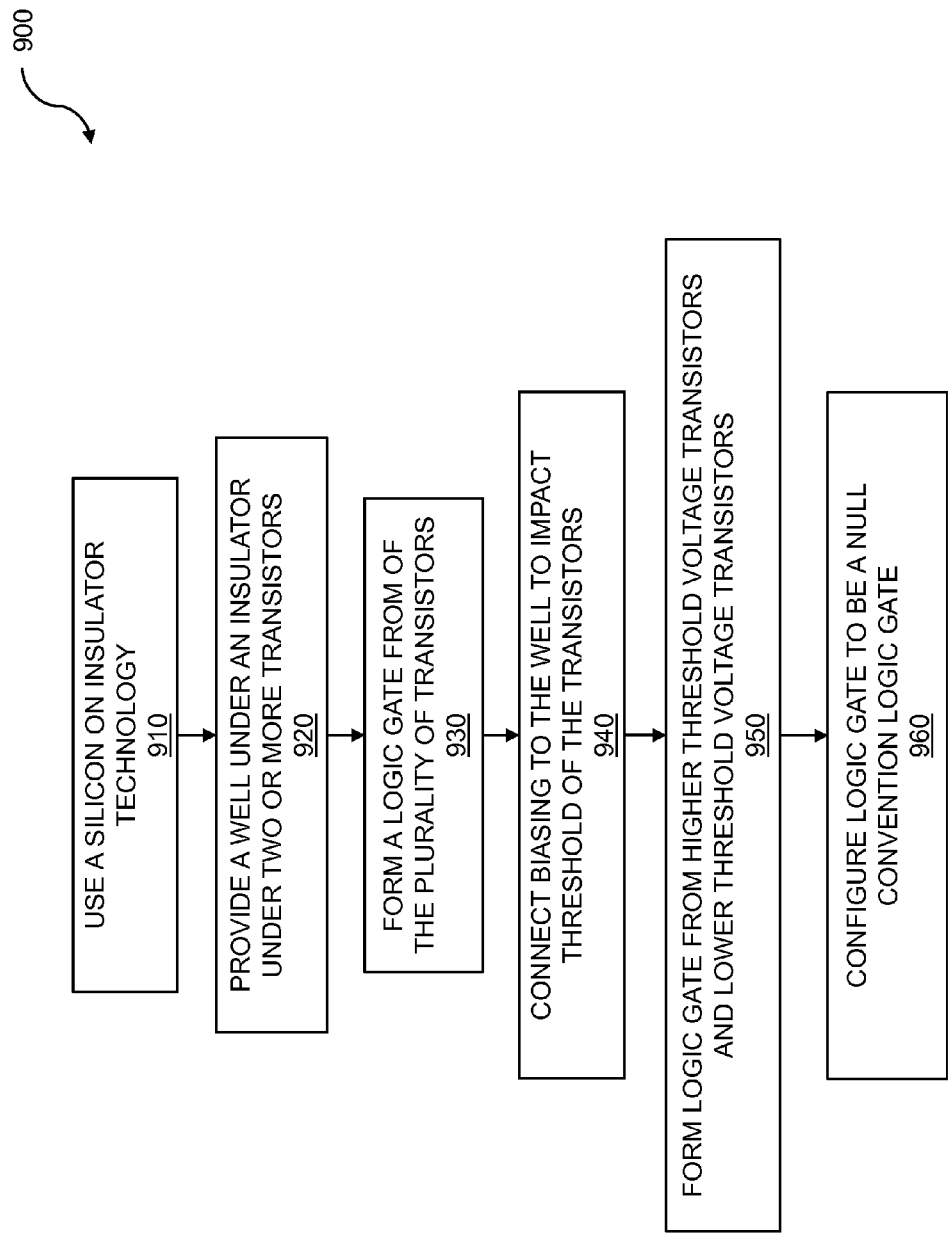
FIG. 9 shows a flow for multi-threshold NCL logic.

FIG. 9 shows a flow 900 for multi-threshold NCL logic. The flow 900 begins with using a silicon-on-insulator (SOI) technology 910. The SOI technology can include a substrate, such as a silicon wafer, with an insulator disposed thereon. The insulator can be a buried oxide (BOX) layer. Disposed over the BOX layer is another semiconductor layer, such as a second silicon layer. This second silicon layer can be referred to as a SOI layer. The flow continues with providing a well under an insulator under two or more transistors 920. The well can be an N-well or a P-well. The flow continues with forming a logic gate from the plurality of transistors 930. The flow continues by connecting biasing to the well to control the threshold voltage on the transistors 940. The flow continues with forming a logic gate from a combination of higher threshold voltage transistors and lower threshold voltage transistors 950. In embodiments, the lower threshold voltage transistors are configured to receive logical input signals, and the higher threshold voltage transistors comprise header and/or footer transistors within a circuit. The flow continues with configuring the logic gate to be a null convention logic (NCL) gate 960. This can include connection of a flash signal and a wake-up signal to higher threshold voltage transistors within the circuit.

Figure 10:
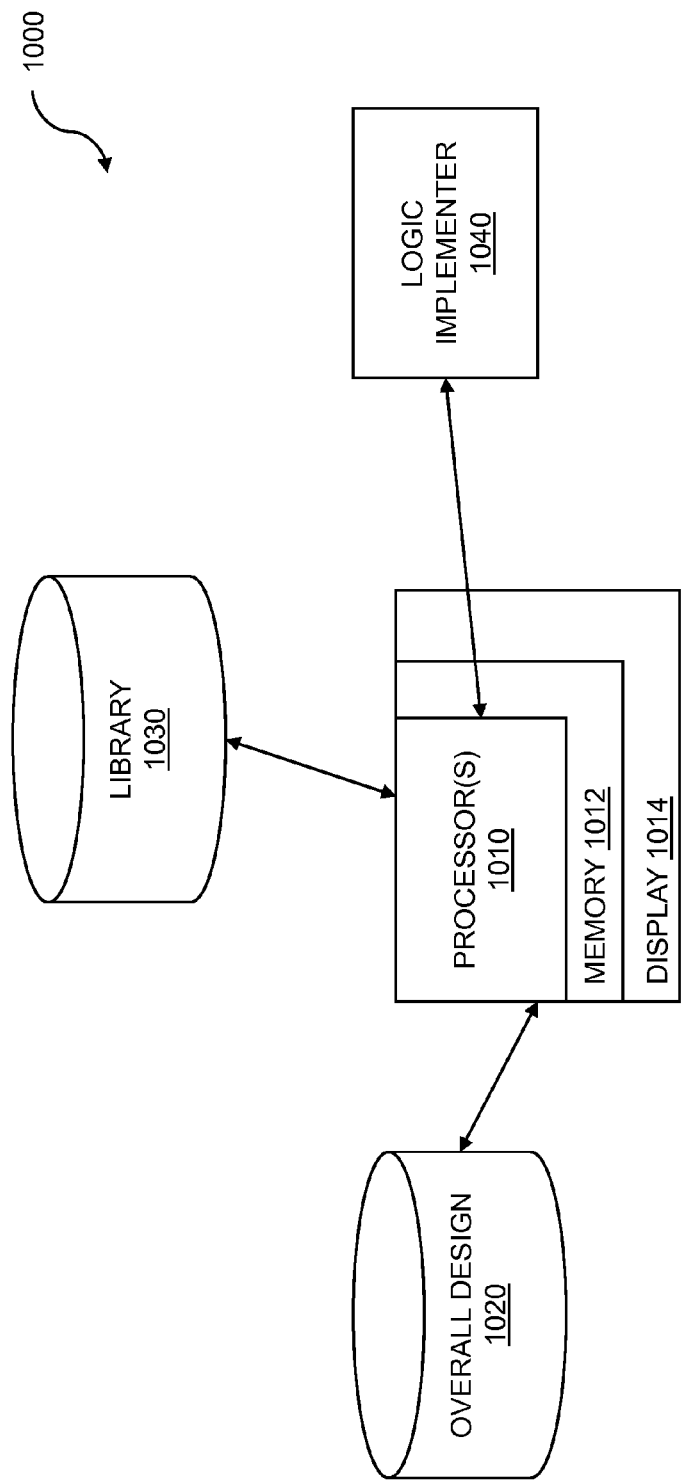
FIG. 10 is a system diagram for logic implementation.

FIG. 10 is a system diagram for logic implementation. The system 1000 can include one or more processors 1010 and a memory 1012 which stores instructions. The memory 1012 is coupled to the one or more processors 1010 wherein the one or more processors 1010 can execute instructions stored in the memory 1012. The memory 1012 can be used for storing instructions, for storing circuit designs, for storing logic designs, for storing data paths, for system support, and the like.

The one or more processors 1010 can read in HDL designs 1020 for a given technology, data path design, and the like. The HDL design 1020 can include information on circuits or designs comprising a plurality of transistors formed in a silicon-on-insulator (SOI) technology, wherein at least some of the plurality of transistors share a common well, and wherein at least some of the plurality of transistors are configured as low-leakage (high Vt) transistors, and wherein at least some of the plurality of transistors are configured as high-speed (low Vt) transistors. The one or more processors 1010 can use the HDL designs 1020 to implement circuits utilizing a combination of high-speed and low-leakage transistors based on design information, such as standard cells contained in library 1030. The library 1030 can provide designs for circuits that include a combination of NFETs and PFETs implemented in a silicon-on-insulator technology. At least some of the NFETs and PFETs share a common well which is biased to create circuits having multiple threshold voltages amongst the various transistors, where some transistors are configured as low-leakage (high Vt) transistors, and some transistors are configured as high-speed (low Vt) transistors. The one or more processors 1010, coupled to the memory 1012, can be configured to include a plurality of gates to implement various multiple threshold voltage designs using a logic implementer 1040. The logic implementer 1040 can implement logic for various circuits which utilize both low-leakage and high-speed transistors. The logic implementer 1040 can use VHDL™, Verilog™, or another hardware description language (HDL) as input that is used to define the desired logic circuits. Further, the logic implementer 1040 can connect a flash input line and a wake up input line to a multiple threshold voltage logic circuit. Information about the various designs can be shown on a display 1014 connected to the one or more processors 1010. The display can comprise a television monitor, a projector, a computer monitor (including a laptop screen, a tablet screen, a net book screen, and the like), a cell phone display, a mobile device, or another electronic display. In some embodiments, the system 1000 can be embodied in a client computer, a server, a cloud server, or a combination thereof. In at least one embodiment, a single computer may incorporate the components described above.

The system 1000 may include a computer program product for implementation of a logical calculation apparatus, embodied in a non-transitory computer readable medium comprising: code for designing a plurality of transistors to form a logic gate where the plurality of transistors are formed in a silicon-on-insulator (SOI) semiconductor technology, wherein: the plurality of transistors include a plurality of PFETs; the plurality of transistors include a plurality of NFETs; a first PFET, from the plurality of PFETs, and a first NFET, from the plurality of NFETs, share a first buried well under an insulator in the silicon-on-insulator semiconductor technology; a second PFET, from the plurality of PFETs, and a second NFET, from the plurality of NFETs, share a second buried well under an insulator in the silicon-on-insulator semiconductor technology; and a first connection biases the first buried well and a second connection biases the second buried well.

Each of the above methods may be executed on one or more processors on one or more computer systems. Embodiments may include various forms of distributed computing, client/server computing, and cloud based computing. Further, it will be understood that the depicted steps or boxes contained in this disclosure's flow charts are solely illustrative and explanatory. The steps may be modified, omitted, repeated, or re-ordered without departing from the scope of this disclosure. Further, each step may contain one or more sub-steps. While the foregoing drawings and description set forth functional aspects of the disclosed systems, no particular implementation or arrangement of software and/or hardware should be inferred from these descriptions unless explicitly stated or otherwise clear from the context. All such arrangements of software and/or hardware are intended to fall within the scope of this disclosure.

The block diagrams and flowchart illustrations depict methods, apparatus, systems, and computer program products. The elements and combinations of elements in the block diagrams and flow diagrams, show functions, steps, or groups of steps of the methods, apparatus, systems, computer program products and/or computer-implemented methods. Any and all such functions—generally referred to herein as a "circuit," "module," or "system"—may be implemented by computer program instructions, by special-purpose hardware-based computer systems, by combinations of special purpose hardware and computer instructions, by combinations of general purpose hardware and computer instructions, and so on.

A programmable apparatus which executes any of the above mentioned computer program products or computer implemented methods may include one or more microprocessors, microcontrollers, embedded microcontrollers, programmable digital signal processors, programmable devices, programmable gate arrays, programmable array logic, memory devices, application specific integrated circuits, or the like. Each may be suitably employed or configured to process computer program instructions, execute computer logic, store computer data, and so on.

It will be understood that a computer may include a computer program product from a computer-readable storage medium and that this medium may be internal or external, removable and replaceable, or fixed. In addition, a computer may include a Basic Input/Output System (BIOS), firmware, an operating system, a database, or the like that may include, interface with, or support the software and hardware described herein.

Embodiments of the present invention are neither limited to conventional computer applications nor the programmable apparatus that run them. To illustrate: the embodiments of the presently claimed invention could include an optical computer, quantum computer, analog computer, or the like. A computer program may be loaded onto a computer to produce a particular machine that may perform any and all of the depicted functions. This particular machine provides a means for carrying out any and all of the depicted functions.

Any combination of one or more computer readable media may be utilized including but not limited to: a non-transitory computer readable medium for storage; an electronic, magnetic, optical, electromagnetic, infrared, or semiconductor computer readable storage medium or any suitable combination of the foregoing; a portable computer diskette; a hard disk; a random access memory (RAM); a read-only memory (ROM), an erasable programmable read-only memory (EPROM, Flash, MRAM, FeRAM, or phase change memory); an optical fiber; a portable compact disc; an optical storage device; a magnetic storage device; or any suitable combination of the foregoing. In the context of this document, a computer readable storage medium may be any tangible medium that can contain or store a program for use by or in connection with an instruction execution system, apparatus, or device.

It will be appreciated that computer program instructions may include computer executable code. A variety of languages for expressing computer program instructions may include without limitation C, C++, Java, JavaScript™, ActionScript™, assembly language, Lisp, Perl, Tcl, Python, Ruby, hardware description languages, database programming languages, functional programming languages, imperative programming languages, and so on. In embodiments, computer program instructions may be stored, compiled, or interpreted to run on a computer, a programmable data processing apparatus, a heterogeneous combination of processors or processor architectures, and so on. Without limitation, embodiments of the present invention may take the form of web-based computer software, which includes client/server software, software-as-a-service, peer-to-peer software, or the like.

In embodiments, a computer may enable execution of computer program instructions including multiple programs or threads. The multiple programs or threads may be processed approximately simultaneously to enhance utilization of the processor and to facilitate substantially simultaneous functions. By way of implementation, any and all methods, program codes, program instructions, and the like described herein may be implemented in one or more threads which may in turn spawn other threads, which may themselves have priorities associated with them. In some embodiments, a computer may process these threads based on priority or other order.

Unless explicitly stated or otherwise clear from the context, the verbs "execute" and "process" may be used interchangeably to indicate execute, process, interpret, compile, assemble, link, load, or a combination of the foregoing. Therefore, embodiments that execute or process computer program instructions, computer-executable code, or the like may act upon the instructions or code in any and all of the ways described. Further, the method steps shown are intended to include any suitable method of causing one or more parties or entities to perform the steps. The parties performing a step, or portion of a step, need not be located within a particular geographic location or country boundary. For instance, if an entity located within the United States causes a method step, or portion thereof, to be performed outside of the United States then the method is considered to be performed in the United States by virtue of the causal entity.

While the invention has been disclosed in connection with preferred embodiments shown and described in detail, various modifications and improvements thereon will become apparent to those skilled in the art. Accordingly, the forgoing examples should not limit the spirit and scope of the present invention; rather it should be understood in the broadest sense allowable by law.

What is claimed is:

1. An apparatus for digital evaluation comprising:
    a plurality of transistors configured to form a logic gate where the plurality of transistors are formed in a silicon-on-insulator (SOI) semiconductor technology, wherein:
        the plurality of transistors include a plurality of PFETs;
        the plurality of transistors include a plurality of NFETs;
        a first PFET, from the plurality of PFETs, and a first NFET, from the plurality of NFETs, share a first buried well under an insulator in the silicon-on-insulator semiconductor technology;
        a second PFET, from the plurality of PFETs, and a second NFET, from the plurality of NFETs, share a second buried well under an insulator in the silicon-on-insulator semiconductor technology; and
        a first connection that biases the first buried well and a second connection that biases the second buried well wherein the first buried well is biased so that the first PFET or the first NFET has a low threshold voltage and the second buried well is biased so that the second PFET or the second NFET has a low threshold voltage.

2. The apparatus of claim 1 wherein transistors with the low threshold voltage are used for logical evaluation.

3. The apparatus of claim 1 wherein one of the first PFET or the first NFET has a high threshold voltage.

4. The apparatus of claim 1 wherein one of the second PFET or the second NFET has a high threshold voltage.

5. The apparatus of claim 1 wherein a PFET, from the plurality of PFETs, is in a buried well with an NFET, from the plurality of NFETs, and the PFET forms a header transistor.

6. The apparatus of claim 5 wherein the header transistor has a high threshold voltage as a result of biasing for the buried well.

7. The apparatus of claim 5 wherein the header transistor includes a source connection and a drain connection where the drain connection provides a virtual power supply rail.

8. The apparatus of claim 1 wherein an NFET, from the plurality of NFETs, is in a buried well with a PFET, from the plurality of PFETs, and the NFET forms a footer transistor.

9. The apparatus of claim 8 wherein the footer transistor has a high threshold voltage as a result of biasing for the buried well.

10. The apparatus of claim 9 wherein the footer transistor, with the high threshold voltage, limits current through the logic gate.

11. The apparatus of claim 8 wherein the footer transistor provides a virtual ground rail.

12. The apparatus of claim 1 wherein the logic gate implements a Boolean logic operation where the logic gate is part of a clocked Boolean logic circuit.

13. The apparatus of claim 1 wherein the logic gate implements a null convention logic (NCL) gate.

14. The apparatus of claim 13 further comprising a flash connection for the NCL gate where the NCL gate is a flash NCL gate.

15. The apparatus of claim 1 wherein biasing for the first buried well is changed dynamically.

16. The apparatus of claim 1 wherein biasing for the second buried well is changed dynamically.

17. The apparatus of claim 1 wherein the plurality of transistors includes a high threshold voltage PFET and a low threshold voltage PFET.

18. The apparatus of claim 1 wherein the plurality of transistors include one or more three-dimensional transistors.

19. A computer program product embodied in a non-transitory computer readable medium for implementation of a logical calculation apparatus comprising:
    code for designing a plurality of transistors to form a logic gate where the plurality of transistors are formed in a silicon-on-insulator (SOI) semiconductor technology, wherein:
        the plurality of transistors include a plurality of PFETs;
        the plurality of transistors include a plurality of NFETs;
        a first PFET, from the plurality of PFETs, and a first NFET, from the plurality of NFETs, share a first buried well under an insulator in the silicon-on-insulator semiconductor technology;
        a second PFET, from the plurality of PFETs, and a second NFET, from the plurality of NFETs, share a second buried well under an insulator in the silicon-on-insulator semiconductor technology; and
        a first connection that biases the first buried well and a second connection that biases the second buried well wherein the first buried well is biased so that the first PFET or the first NFET has a low threshold voltage and the second buried well is biased so that the second PFET or the second NFET has a low threshold voltage.

20. A computer system for implementation of a logical calculation apparatus comprising:
    a memory which stores instructions;
    one or more processors coupled to the memory wherein the one or more processors are configured to:
        design a plurality of transistors to form a logic gate where the plurality of transistors are formed in a silicon-on-insulator (SOI) semiconductor technology, wherein:
            the plurality of transistors include a plurality of PFETs;
            the plurality of transistors include a plurality of NFETs;
            a first PFET, from the plurality of PFETs, and a first NFET, from the plurality of NFETs, share a first buried well under an insulator in the silicon-on-insulator semiconductor technology;

a second PFET, from the plurality of PFETs, and a second NFET, from the plurality of NFETs, share a second buried well under an insulator in the silicon-on-insulator semiconductor technology; and a first connection that biases the first buried well and a second connection that biases the second buried well wherein the first buried well is biased so that the first PFET or the first NFET has a low threshold voltage and the second buried well is biased so that the second PFET or the second NFET has a low threshold voltage.

* * * * *